(12) United States Patent
Lin et al.

(10) Patent No.: US 11,670,749 B2
(45) Date of Patent: Jun. 6, 2023

(54) METHOD FOR MANUFACTURING LIGHT EMITTING DIODE PACKAGING STRUCTURE

(71) Applicant: Lextar Electronics Corporation, Hsinchu (TW)

(72) Inventors: Chih-Hao Lin, Hsinchu (TW); Jo-Hsiang Chen, Hsinchu (TW); Shih-Lun Lai, Hsinchu (TW); Min-Che Tsai, Hsinchu (TW); Jian-Chin Liang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 17/653,462

(22) Filed: Mar. 3, 2022

(65) Prior Publication Data
US 2022/0190225 A1      Jun. 16, 2022

Related U.S. Application Data

(62) Division of application No. 16/944,131, filed on Jul. 30, 2020, now Pat. No. 11,296,269.

(51) Int. Cl.
*H01L 33/62* (2010.01)
*H01L 33/58* (2010.01)
*H01L 33/00* (2010.01)

(52) U.S. Cl.
CPC .......... *H01L 33/62* (2013.01); *H01L 33/0095* (2013.01); *H01L 33/58* (2013.01); *H01L 2933/0058* (2013.01); *H01L 2933/0066* (2013.01)

(58) Field of Classification Search
CPC ..... H01L 33/62; H01L 33/0095; H01L 33/58; H01L 2933/0058; H01L 2933/0066
See application file for complete search history.

(56) References Cited

U.S. PATENT DOCUMENTS

| | | | |
|---|---|---|---|
| 9,947,800 B2 | 4/2018 | Yamazaki et al. | |
| 10,290,745 B2 | 5/2019 | Yamazaki et al. | |
| 2018/0007750 A1* | 1/2018 | Meitl | H01L 22/24 |
| 2018/0294254 A1* | 10/2018 | Chen | H01L 33/62 |
| 2019/0229097 A1 | 7/2019 | Takeya et al. | |
| 2020/0235261 A1* | 7/2020 | Hu | H01L 25/0753 |
| 2020/0287110 A1* | 9/2020 | Oh | H01L 33/62 |

(Continued)

*Primary Examiner* — Victor A Mandala
(74) *Attorney, Agent, or Firm* — CKC & Partners Co., LLC

(57) ABSTRACT

A method for manufacturing a light emitting diode packaging structure includes the operations below. A flexible substrate having a first surface and a second surface is provided. A carrier substrate is formed on the first surface. An adhesive layer is formed on the second surface. A micro light emitting element is formed on the adhesive layer. The micro light emitting element has a conductive pad thereon opposite to the adhesive layer. A redistribution layer is formed and covers the micro light emitting element and the adhesive layer, wherein the redistribution layer includes a circuit layer electrically connecting to the conductive pad and an insulating layer covering the circuit layer. An electrode pad is formed on the redistribution layer and electrically connected to the circuit layer, wherein a total thickness of the flexible substrate, the adhesive layer, the redistribution layer, and the electrode pad is less than 200 um.

12 Claims, 6 Drawing Sheets

(56) References Cited

U.S. PATENT DOCUMENTS

| | | | |
|---|---|---|---|
| 2020/0321234 A1* | 10/2020 | Choi | H01L 21/6835 |
| 2020/0403114 A1* | 12/2020 | Meng | H01L 25/0753 |
| 2021/0125970 A1* | 4/2021 | Li | H01L 33/62 |
| 2021/0134775 A1* | 5/2021 | Liu | H01L 27/1218 |
| 2021/0159363 A1* | 5/2021 | Xu | H01L 25/0753 |
| 2021/0217740 A1* | 7/2021 | Lee | H01L 25/13 |
| 2021/0336103 A1* | 10/2021 | Chen | H01L 33/0012 |

* cited by examiner

20c

20d

METHOD FOR MANUFACTURING LIGHT EMITTING DIODE PACKAGING STRUCTURE

CROSS-REFERENCE TO RELATED APPLICATION

The present application is a Divisional Application of the U.S. application Ser. No. 16/944,131, filed Jul. 30, 2020, which is herein incorporated by reference in its entirety.

BACKGROUND

Field of Invention

The present disclosure relates to a method for manufacturing a light emitting diode packaging structure.

Description of Related Art

Compared with the traditional illumination source, the light emitting diode (LED) has the advantages of light weight, small volume, low pollution and long life. It has been used as a new type of illumination source. In various fields, such as street lamps, traffic lights, signal lights, spotlights and decorative lights. A typical light emitting diode packaging structure includes a rigid printed circuit board, a light emitting chip disposed on the rigid printed circuit board and electrically connected to the circuits in the rigid printed circuit board, and an encapsulate layer disposed on the rigid printed circuit board and sealing the light emitting chip. In general, the typical light emitting diode packaging structure has a greater thickness due to the rigid printed circuit board and the circuits should be thick enough for providing sufficient strength when forming the encapsulate layer.

In order to satisfy user demand for light, thin, short, and small electronic devices, the size of light emitting diode packages is getting smaller day by day. In view of the above, it is necessary to provide a light emitting diode package structure having a thinner thickness and a method of manufacturing thereof.

SUMMARY

According to an aspect of the present disclosure, a method for manufacturing a light emitting diode packaging structure is provided. The method includes the operations below. A flexible substrate having a first surface and a second surface opposite thereof is provided. A carrier substrate is formed on the first surface. An adhesive layer is formed on the second surface. A micro light emitting element is formed on the adhesive layer, wherein the micro light emitting element has a conductive pad thereon opposite to the adhesive layer. A redistribution layer is formed and covers the micro light emitting element and the adhesive layer, wherein the redistribution layer includes a circuit layer electrically connecting to the conductive pad and an insulating layer covering the circuit layer. An electrode pad is formed on the redistribution layer and electrically connected to the circuit layer, wherein a total thickness of the flexible substrate, the adhesive layer, the redistribution layer, and the electrode pad is less than 200 um.

In some embodiments of the present disclosure, the method further includes the operations below. After forming the electrode pad, the carrier substrate is removed. The flexible substrate is diced along a scribe line to form a plurality of light emitting diode packaging structures.

In some embodiments of the present disclosure, the method further includes the operations below. After removing the carrier substrate, texturing the first surface of the flexible substrate is textured.

In some embodiments of the present disclosure, the first surface of the flexible substrate of each of the light emitting diode packaging structures is an uneven surface.

In some embodiments of the present disclosure, the method further includes the operations below. A microstructure is formed on the first surface of the flexible substrate.

In some embodiments of the present disclosure, the microstructure includes an optical lens, an optical coating layer, or an optical film.

In some embodiments of the present disclosure, the method further includes the operations below. After removing the carrier substrate, the first surface of the flexible substrate is flatten.

In some embodiments of the present disclosure, the method further includes the operations below. After forming the electrode pad, the flexible substrate is diced along a scribe line to form a plurality of light emitting diode packaging structure.

In some embodiments of the present disclosure, the method further includes the operations below. Before forming the electrode pad and after forming the redistribution layer, a conductive via is formed in the redistribution layer so that the conductive via electrically connects the electrode pad to the circuit layer.

In some embodiments of the present disclosure, the method further includes the operations below. An alignment mark is formed on the carrier substrate.

In some embodiments of the present disclosure, a portion of the circuit layer is in direct contact with the adhesive layer.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
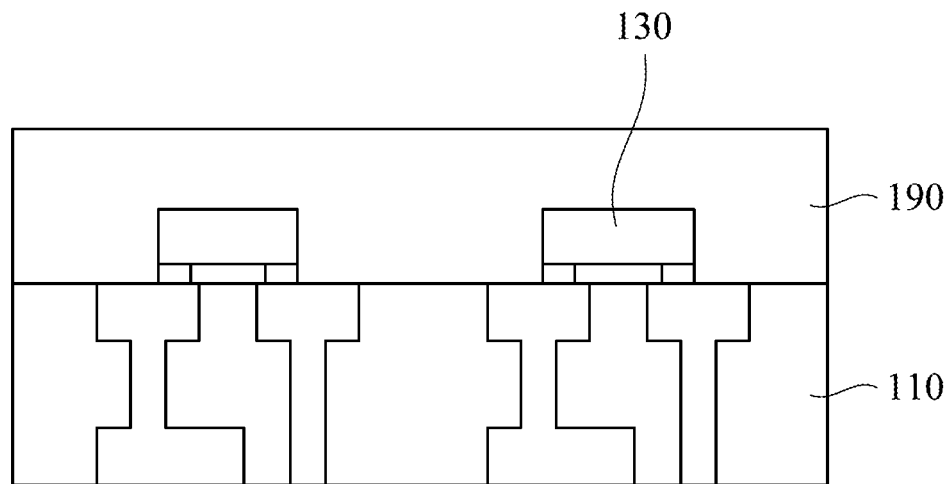
FIG. 1 is a cross-sectional view illustrating a light emitting diode packaging structure according to one comparative example of the present disclosure.

Reference will now be made in detail to the present embodiments of the invention, examples of which are illustrated in the accompanying drawings. Wherever possible, the same reference numbers are used in the drawings and the description to refer to the same or like parts. Reference will now be made in detail to the present embodiments of the disclosure, examples of which are illustrated in the accompanying drawings. Wherever possible, the same reference numbers are used in the drawings and the description to refer to the same or like parts.

The terms "about" and "approximately" in the disclosure are used as equivalents. Any numerals used in this disclosure with or without "about," "approximately," etc. are meant to cover any normal fluctuations appreciated by one of ordinary skill in the relevant art. In certain embodiments, the term "approximately" or "about" refers to a range of values that fall within 20%, 10%, 5%, or less in either direction (greater or less than) of the stated reference value unless otherwise stated or otherwise evident from the context.

FIG. 1 is a cross-sectional view illustrating a light emitting diode packaging structure 10 according to one comparative example of the present disclosure. Referring to FIG. 1, the light emitting diode packaging structure 10 disclosed herein includes a rigid substrate 110, a light emitting element 130, and an encapsulation layer 190. To be specific, the rigid substrate 110 is a rigid printed circuit board (PCB). The rigid substrate 110 may include epoxy molding compound (EMC). In addition, the rigid substrate 110 may further include metallic circuits, such as, copper circuits, iron circuits, or other alloy circuit with good conductivity. For example, the rigid substrate 110 may be a FR-4 substrate, BT substrate, or a molded interconnect substrate (MIS).

As shown in FIG. 1, the light emitting element 130 is disposed on the rigid substrate 110 and electrically connected to the circuit layer in the rigid substrate 110. The encapsulation layer 190 is disposed on the rigid substrate 110 and covers the light emitting element 130. It would be understood that a total thickness of the light emitting diode packaging structure 10 using the rigid printed circuit board and known molding process is usually greater than 200 um.

Figure 2A:
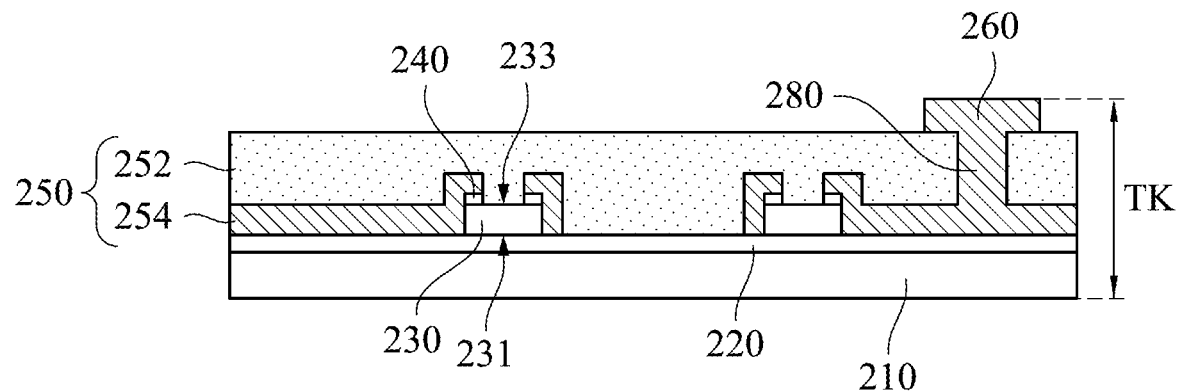
FIGS. 2A, 2B, 2C, and 2D are cross-sectional views illustrating a light emitting diode packaging structure according to various embodiments of the present disclosure.

FIG. 2A is a cross-sectional view illustrating a light emitting diode packaging structure 20a according to various embodiments of the present disclosure. The light emitting diode packaging structure 20a includes a flexible substrate 210, a first adhesive layer 220, a micro light emitting element 230, a conductive pad 240, a redistribution layer 250, and an electrode pad 260. To be specific, the flexible substrate 210 may include transparent materials so as to meet the requirement of the transparent display. In some embodiments of the present disclosure, the flexible substrate 210 may include polyimide, polyethylene terephthalate, poly(ethylene naphthalate), polycarbonate, glass or a combination thereof. It can be understood that the flexible substrate 210 is used to decrease an overall thickness of the light emitting diode packaging structure 20a and provides flexibility for the light emitting diode packaging structure 20a. It should be noted that the thickness of the flexible substrate 210 is less than 100 um. In some embodiments of the present disclosure, a bottom surface 211 of the flexible substrate 210 may be an even surface or an uneven surface to increase the light efficiency or modify the light profile. It can be understood that the bottom surface 211 of the flexible substrate 210 may be a light emitting surface. In addition, another surface opposite to the bottom surface 211 of the flexible substrate may also be a light emitting surface.

As shown in FIG. 2A, the first adhesive layer 220 is disposed on the flexible substrate 210. In some embodiments of the present disclosure, the first adhesive layer 220 may include insulating glue. For example, the material of the first adhesive layer 220 may be insulating glue such as epoxy resin or silicone, but not limited thereto.

As shown in FIG. 2A, the micro light emitting element 230 is disposed on the first adhesive layer 220. Specifically, the micro light emitting element 230 has a first surface 231 facing to the first adhesive layer 220 and a second surface 233 opposite to the first surface 231. Although a number of he micro light emitting element 230 as shown in FIG. 2A is two, the number of he micro light emitting element 230 may be 3, 4, 5, 6, or more according to demand. The micro light emitting element 230 may emit red light, green light, blue light, or white light, but not limited thereto.

As shown in FIG. 2A, the conductive pad 240 is disposed on the second surface 233 of the micro light emitting element 230. In some embodiments of the present disclosure, the conductive pad 240 may include conductive materials, such as copper, nickel, gold, aluminum, tungsten, iron, or alloys of above metals.

As shown in FIG. 2A, the redistribution layer 250 covers the micro light emitting element 230 and the conductive pad 240. Specifically, the redistribution layer 250 includes an insulating layer 252 and a circuit layer 254 embedded in the insulating layer 252, and the circuit layer 254 is electrically connected to the conductive pad 240. It should be noted that the insulating layer 252 is transparent, so that the light emitted from the micro light emitting element 230 can pass through the insulating layer 252 to the outside of the light emitting diode packaging structure 20a. It can be understood that the insulating layer 252 could also be used as a protective layer. Specifically, because the insulating layer 252 covers the micro light emitting element 230 and the circuit layer 254, the insulating layer 252 can block moisture permeation and avoid oxidation of the circuit layer 254. Therefore, the light emitting diode packaging structure 20a of the present disclosure is not necessary to additionally include a protective layer. Although the number of the redistribution layer 250 is one as shown in FIG. 2A, the number of the redistribution layer 250 can be two, three, or four according to design requirements.

In some embodiments of the present disclosure, the insulating layer 252 may include poly(methyl methacrylate) (PMMA), polyethylene terephthalate (PET), polystyrene (PS), polypropylene(PP), polyamide (PA), polycarbonate (PC), epoxy, silicon, and/or a combination thereof. In some embodiments of the present disclosure, the circuit layer 254 may include copper, nickel, gold, aluminum, tungsten, iron, or alloys of above metals. In some embodiments of the present disclosure, a portion of the circuit layer 254 is in direct contact with the first adhesive layer 220 as shown in FIG. 2A.

As shown in FIG. 2A, the electrode pad 260 is disposed on the redistribution layer 250 and electrically connected to the circuit layer 254. It is noted that a total thickness TK of the flexible substrate 210, the first adhesive layer 220, the redistribution layer 250, and the electrode pad 260 is less than 200 um. For example, the total thickness TK of the flexible substrate 210, the first adhesive layer 220, the redistribution layer 250, and the electrode pad 260 may be about 100 um, 110 um, 120 um, 130 um, 140 um, 150 um, 160 um, 170 um, 180 um, or 190 um. In some embodiments of the present disclosure, the electrode pad 260 may include copper, nickel, gold, aluminum, tungsten, iron, or alloys of above metals.

In some embodiments of the present disclosure, the light emitting diode packaging structure 20a further includes a conductive via 280 electrically connecting the electrode pad 260 to the circuit layer 254. The material of the conductive via 280 may be the same as or similar to the material of the electrode pad 260.

Figure 2B:
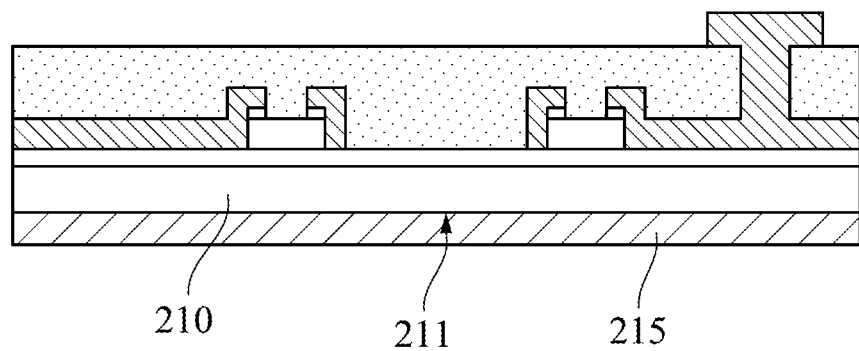

FIG. 2B is a cross-sectional view illustrating a light emitting diode packaging structure 20b according to various embodiments of the present disclosure. The light emitting diode packaging structure 20b of FIG. 2B is similar to that of FIG. 2A. The difference between the light emitting diode packaging structure 20b and the light emitting diode packaging structure 20a of the previous embodiment is that, in this embodiment, the light emitting diode packaging structure 20b further includes a microstructure 215 disposed on the bottom surface 211 of the flexible substrate 210. In some embodiments of the present disclosure, the microstructure 215 may include an optical lens, an optical coating layer, or an optical film. For example, the optical lens may include resin, plastic, glass, or sapphire, but not limited thereto. The optical coating layer may include $SiN_x$, $SiO_x$, $TiO_2$, $Al_2O_3$, or $MgF_2$, but not limited thereto. The optical film may be a linear polarizer, a circular polarizer, or a phase compensation plate, but not limited thereto.

Figure 2C:
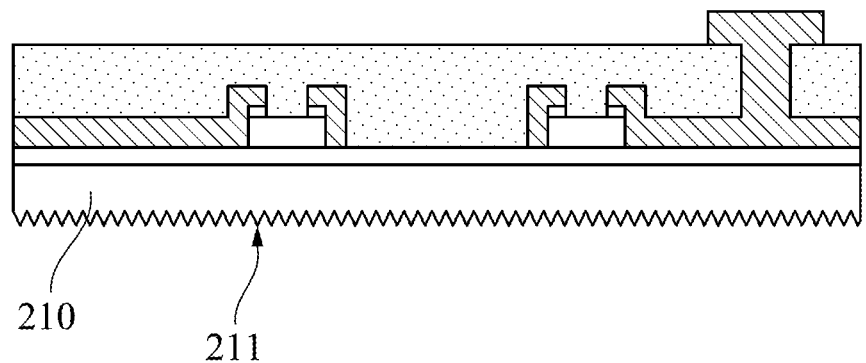

FIG. 2C is a cross-sectional view illustrating a light emitting diode packaging structure 20c according to various embodiments of the present disclosure. The light emitting diode packaging structure 20c of FIG. 2C is similar to that of FIG. 2A. The difference between the light emitting diode packaging structure 20c and the light emitting diode packaging structure 20a of the previous embodiment is that, in this embodiment, the bottom surface 211 of the flexible substrate 210 of the light emitting diode packaging structure 20c is an uneven surface. Specifically, the bottom surface 211 of the flexible substrate 210 of the light emitting diode packaging structure 20b may have a roughness by a surface roughening treatment.

Figure 2D:
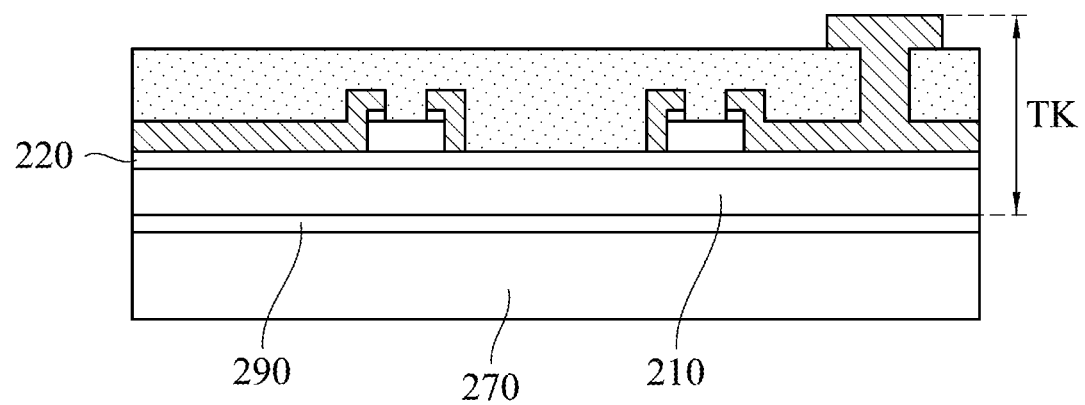

FIG. 2D is a cross-sectional view illustrating a light emitting diode packaging structure 20d according to various embodiments of the present disclosure. The light emitting diode packaging structure 20d of FIG. 2D is similar to that of FIG. 2A. The difference between the light emitting diode packaging structure 20d and the light emitting diode packaging structure 20a of the previous embodiment is that, in this embodiment, the light emitting diode packaging structure 20d further includes a carrier substrate 270 and a second adhesive layer 290. To be specific, the carrier substrate 270 is disposed on the bottom surface 211 of the flexible substrate 210. The second adhesive layer 290 is disposed between the carrier substrate 270 and the flexible substrate 210 to increase the bonding force between the carrier substrate 270 and the flexible substrate 210. The material of the second adhesive layer 290 may be the same as or similar to the material of the first adhesive layer 220. In some embodiments of the present disclosure, the carrier substrate 270 may include an alignment mark (not shown) thereon. In some embodiments of the present disclosure, the carrier substrate 270 may be transparent, translucent, or opaque. In some embodiments of the present disclosure, the carrier substrate 270 may include organic materials, inorganic materials, or metallic materials, but not limited thereto.

A method for manufacturing a light emitting diode packaging structure 20a and 20d is also provided herein. FIGS. 3, 4, 5, 6, 7, 8A, and 8B are cross-sectional views illustrating various process stages of manufacturing the light emitting diode packaging structure 20a and 20d according to various embodiments of the present disclosure.

Figure 3:
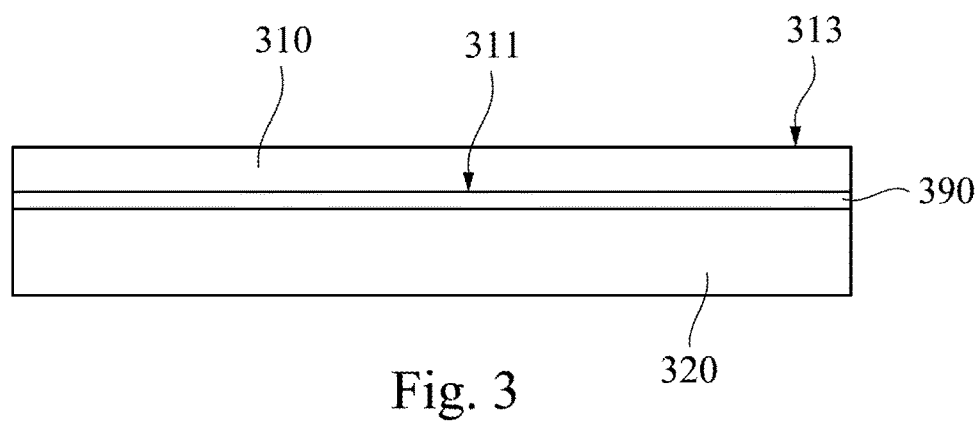
FIGS. 3, 4, 5, 6, 7, 8A, and 8B are cross-sectional views illustrating various process stages of manufacturing the light emitting diode packaging structure according to various embodiments of the present disclosure.

Referring to FIG. 3, a flexible substrate 310 is provided. To be specific, the flexible substrate 310 has a first surface 311 and a second surface 313 opposite thereof. It should be noted that the material and other features of the flexible substrate 310 may be the same as or similar to that of the flexible substrate 210 shown in FIG. 2A, and the description thereof is omitted.

As shown in FIG. 3, a carrier substrate 320 is formed on the first surface 311 of the flexible substrate 310. To be specific, the carrier substrate 320 is formed on the first surface 311 of the flexible substrate 310 by an adhesive layer 390. It can be understood that the adhesive layer 390 can increase the bonding force between the carrier substrate 320 and the flexible substrate 310. It should be noted that the material and other features of the carrier substrate 320 and the adhesive layer 390 may be the same as or similar to that of the carrier substrate 270 and the second adhesive layer 290 shown in FIG. 2D, and the description thereof is omitted. The carrier substrate 320 can provide support for various stages of a manufacturing the light emitting diode packaging structure 20a and 20d. In some embodiments of the present disclosure, an alignment mark (not shown) may be formed on the carrier substrate 320 to provide an alignment mark for various stages of a manufacturing the light emitting diode packaging structure 20a and 20d.

Figure 4:
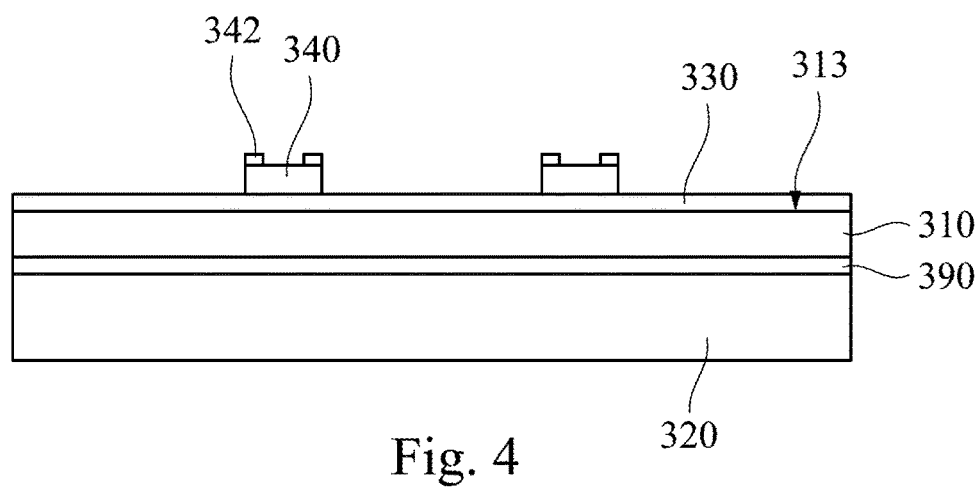

Referring to FIG. 4, an adhesive layer 330 is formed on the second surface 313 of the flexible substrate 310. In some embodiments of the present disclosure, the adhesive layer 330 fully covers the second surface 313 of the flexible substrate 310. It should be noted that the material and other features of the adhesive layer 330 may be the same as or similar to that of the first adhesive layer 220 shown in FIG. 2A, and the description thereof is omitted.

Referring to FIG. 4, a micro light emitting element 340 is formed on the adhesive layer 330. To be specific, the micro light emitting element 340 has a conductive pad 342 thereon opposite to the adhesive layer 330. It should be noted that the material and other features of the micro light emitting element 340 and the conductive pad 342 may be the same as or similar to that of the micro light emitting element 230 and the conductive pad 240 shown in FIG. 2A, and the description thereof is omitted.

Figure 5:
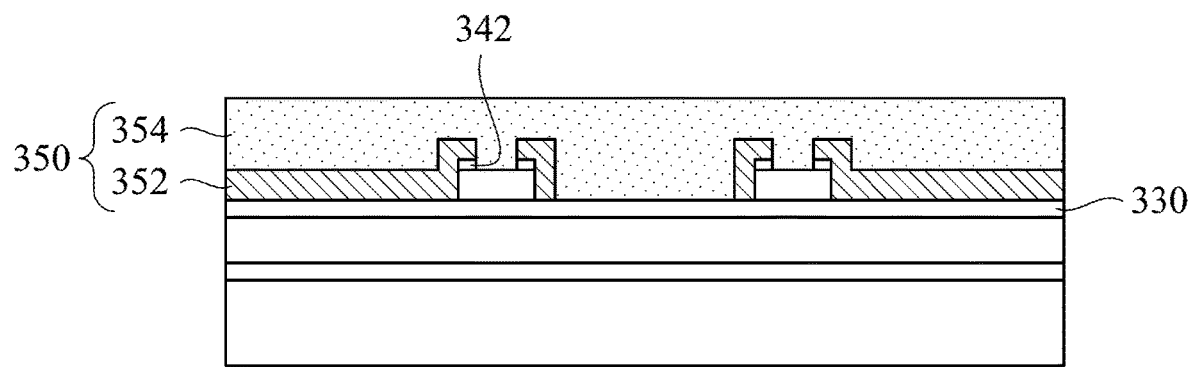

Referring to FIG. 5, a redistribution layer 350 covers the micro light emitting element 340 and the adhesive layer 330. To be specific, the redistribution layer 350 includes a circuit layer 352 electrically connecting to the conductive pad 342 and an insulating layer 354 covering the circuit layer 352. In some embodiments of the present disclosure, a portion of the circuit layer 352 is in direct contact with the adhesive layer 330. In some embodiments of the present disclosure, the redistribution layer 350 could be formed by the redistribution layer (RDL) technical to achieve the effect of thin line width. It should be noted that the material and other features of the circuit layer 352 and the insulating layer 354 may be the same as or similar to that of the circuit layer 254 and the insulating layer 252 shown in FIG. 2A, and the description thereof is omitted.

Figure 6:
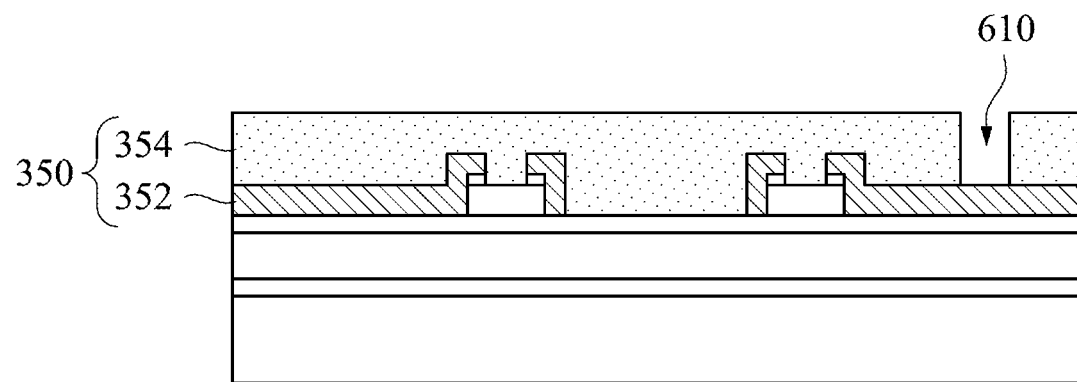
Figure 7:
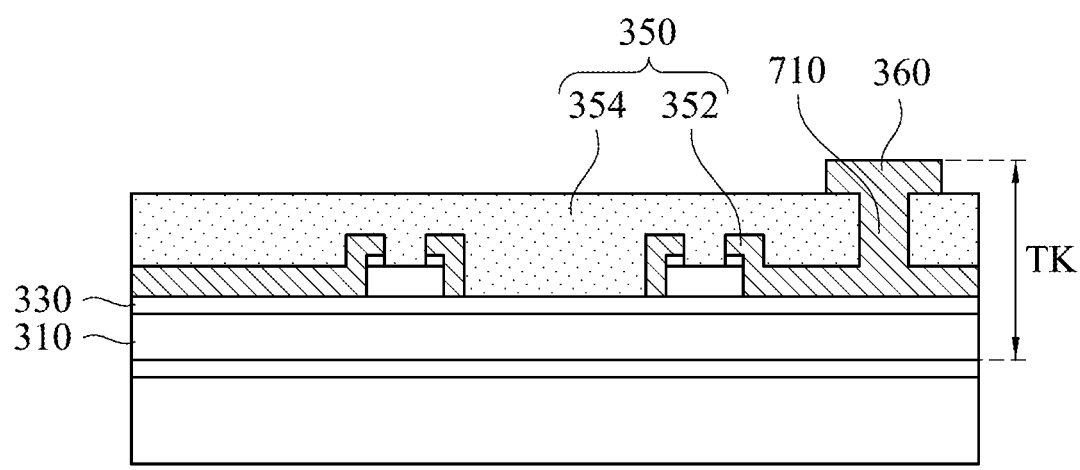

Referring to FIGS. 6-7, an electrode pad 360 is formed on the redistribution layer 350 and electrically connected to the circuit layer 352. In some embodiments of the present disclosure, before forming the electrode pad 360 and after forming the redistribution layer 350, the method further includes forming a conductive via 710 in the redistribution layer 350 so that the conductive via 710 electrically connects the electrode pad 360 to the circuit layer 352. For example, a through hole 610 may be first formed to penetrate the insulating layer 354 and therefore a portion of the circuit layer 352 is exposed from the through hole 610. For example, the through hole 610 could be formed by lithography process, drilling process, laser drilling process, or other suitable processes. Next, a conductive material is filled up the through hole 610 to form the conductive via 710. The electrode pad 360 then covers the conductive via 710. It can be understood that the conductive via 710 and the electrode pad 360 can be formed separately or simultaneously. It is noted that a total thickness TK of the flexible substrate 310, the adhesive layer 330, the redistribution layer 350, and the electrode pad 360 is less than 200 um. For example, the total thickness TK of the flexible substrate 310, the adhesive layer 330, the redistribution layer 350, and the electrode pad 360 may be about 100 um, 110 um, 120 um, 130 um, 140 um, 150 um, 160 um, 170 um, 180 um, or 190 um.

Figure 8A:
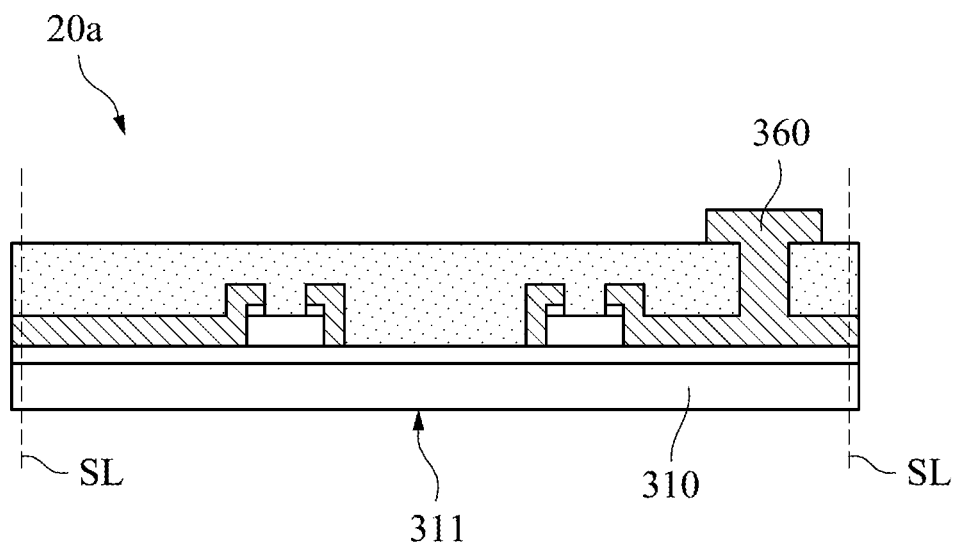

Next, referring to FIG. 8A, after forming the electrode pad 360, the method further includes removing the carrier substrate 320 and dicing the flexible substrate 310 along a scribe line SL to form a plurality of light emitting diode packaging structure 20a. In some embodiments of the present disclosure, after removing the carrier substrate 320, the method further includes texturing the first surface 311 of the flexible substrate 310 or forming a microstructure (not shown) on the first surface 311 of the flexible substrate. For example, the microstructure is the same as or similar to the microstructure 215 shown in FIG. 2B, such as an optical lens, an optical coating layer, or an optical film. In some embodiments of the present disclosure, after removing the carrier substrate 320, the method further includes flattening the first surface 311 of the flexible substrate 310.

Figure 8B:
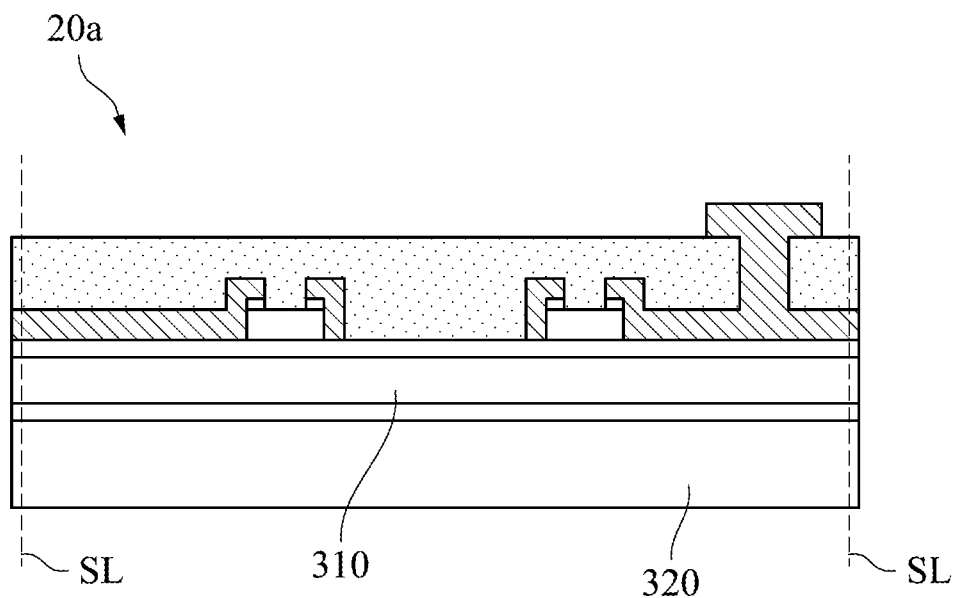

Alternatively, referring to FIG. 8B, after forming the electrode pad 360, the method further includes dicing the flexible substrate 310 along a scribe line SL to form a plurality of light emitting diode packaging structure 20d. It is noted that the carrier substrate 320 may not be removed.

From the embodiments described above of the present disclosure, the light emitting diode packaging structure and the method for manufacturing thereof can decrease the overall thickness to less than 200 um. More specifically, the light emitting diode packaging structure of the present disclosure uses the flexible substrate to replace the core layer of the rigid substrate of traditional light emitting diode packaging structure, so that the overall thickness of the light emitting diode packaging structure can be reduced and flexible product requirements can be met. Moreover, the present disclosure also uses redistribution layer technology to reduce the thickness of the rigid substrate multilayer process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A method for manufacturing a light emitting diode packaging structure, comprising: providing a flexible substrate having a first surface and a second surface opposite thereof; forming a carrier substrate on the first surface; forming an adhesive layer on the second surface; forming a micro light emitting element on the adhesive layer, wherein the micro light emitting element has a conductive pad thereon opposite to the adhesive layer; forming a redistribution layer covering the micro light emitting element and the adhesive layer, wherein the redistribution layer comprises a circuit layer electrically connecting to the conductive pad and an insulating layer covering the circuit layer; and forming an electrode pad on the redistribution layer and electrically connecting to the circuit layer, wherein a total thickness of the flexible substrate, the adhesive layer, the redistribution layer, and the electrode pad is less than 200 µm.

2. The method of claim 1, further comprising:
after forming the electrode pad, removing the carrier substrate; and
dicing the flexible substrate along a scribe line to form a plurality of light emitting diode packaging structures.

3. The method of claim 2, further comprising:
after removing the carrier substrate, texturing the first surface of the flexible substrate.

4. The method of claim 3, wherein the first surface of the flexible substrate of each of the light emitting diode packaging structures is an uneven surface.

5. The method of claim 2, further comprising:
forming a microstructure on the first surface of the flexible substrate.

6. The method of claim 5, wherein the microstructure comprises an optical lens, an optical coating layer, or an optical film.

7. The method of claim 2, further comprising:
after removing the carrier substrate, flattening the first surface of the flexible substrate.

8. The method of claim 1, further comprising:
after forming the electrode pad, dicing the flexible substrate along a scribe line to form a plurality of light emitting diode packaging structures.

9. The method of claim 1, further comprising:
before forming the electrode pad and after forming the redistribution layer, forming a conductive via in the redistribution layer so that the conductive via electrically connects the electrode pad to the circuit layer.

10. The method of claim 1, wherein the flexible substrate comprises polyimide, polyethylene terephthalate, poly(ethylene naphthalate), polycarbonate, glass or a combination thereof.

11. The method of claim 1, further comprising:
forming an alignment mark on the carrier substrate.

12. The method of claim 1, wherein a portion of the circuit layer is in direct contact with the adhesive layer.

* * * * *